(12) United States Patent
Tran

(10) Patent No.: US 7,080,337 B2
(45) Date of Patent: Jul. 18, 2006

(54) NON-UNIFORM DECOUPLING CAPACITOR DISTRIBUTION FOR PROVIDING MORE UNIFORM NOISE REDUCTION ACROSS CHIP

(75) Inventor: Thanh T. Tran, Houston, TX (US)

(73) Assignee: Texas Instruments Incorporated, Dallas, TX (US)

( * ) Notice: Subject to any disclaimer, the term of this patent is extended or adjusted under 35 U.S.C. 154(b) by 291 days.

(21) Appl. No.: 10/749,501

(22) Filed: Dec. 31, 2003

(65) Prior Publication Data

US 2004/0250229 A1 Dec. 9, 2004

Related U.S. Application Data

(60) Provisional application No. 60/476,204, filed on Jun. 5, 2003.

(51) Int. Cl.
*G06F 17/50* (2006.01)
(52) U.S. Cl. .................... 716/10; 716/1; 716/2; 716/11
(58) Field of Classification Search .................... 716/1, 716/2, 7, 10, 11
See application file for complete search history.

(56) References Cited

U.S. PATENT DOCUMENTS 6,385,565 B1 * 5/2002 Anderson et al. ............... 716/1

OTHER PUBLICATIONS

Jung, S., et al., "Packaging Consideration for 1 Gbps Si CMOS Optical Driver," IEEE (2000) pp. 882-883.
Fan, J., et al., "Quantifying Decoupling Capacitor Location," IEEE (Feb. 2000) pp. 761-766.

* cited by examiner

*Primary Examiner*—Thuan Do
(74) *Attorney, Agent, or Firm*—Yingsheng Tung; Wade James Brady, III; Frederick J. Telecky, Jr.

(57) ABSTRACT

An embodiment of the present invention includes a method of providing a non-uniform distribution of decoupling capacitors to provide a more uniform noise level across the chip. Leads on a packaged semiconductor chip are grouped into two or more regions. Types of leads needing decoupling capacitors are grouped into lead categories. For each region, there may be one or more lead categories therein. One or more decoupling capacitors are preferably assigned to each lead category in each region. Calculations may be performed to estimate a desired capacitance for each decoupling capacitor for each lead category in each region. When a chip has different components operating at different switching frequencies, different voltages, and/or different switching currents, the distribution of the decoupling capacitors will likely be non-uniform to provide a more uniform noise level across the chip, as compared to a uniform distribution of decoupling capacitors for the chip.

21 Claims, 6 Drawing Sheets

NON-UNIFORM DECOUPLING CAPACITOR DISTRIBUTION FOR PROVIDING MORE UNIFORM NOISE REDUCTION ACROSS CHIP

This application claims the benefit of U.S. Provisional Application No. 60/476,204 filed on Jun. 5, 2003, entitled Non-Uniform Distribution of Decoupling Capacitor Networks For High Pin Count BGA-Based System Design, which application is hereby incorporated herein by reference.

TECHNICAL FIELD

The present invention generally relates to packaged semiconductor devices. In one aspect it relates more particularly to providing decoupling capacitors for a packaged integrated circuit chip.

BACKGROUND

Often decoupling capacitors are added to a printed circuit board and connected to certain power or voltage supply leads, and/or certain critical signal leads on a semiconductor chip having integrated circuits therein to reduce switching noise, to reduce the amount of electromagnetic energy radiated from the semiconductor chip, and/or to reduce or prevent excessive voltage ripples. Also, bulk capacitors (typically larger than the decoupling capacitors) are sometimes used as well, but may not be critical and may not be needed. In such cases where bulk capacitors are also used, the bulk capacitors may be used to filter low-frequency voltage ripple and/or to more quickly recharge the decoupling capacitors.

Decoupling capacitors are also sometimes referred to as bypass capacitors in the art. Furthermore, the term "lead" is used generically herein to refer to any type of electrical connector on a packaged semiconductor chip for electrically connecting the packaged chip to another packaged chip or to a circuit board, including (but not necessarily limited to): solder bumps or solder balls on a ball grid array package, pins on a pin grid array package, or leads on a TSOP package, for example. As will be apparent to one of ordinary skill in the art, "leads" of a chip, as well as chip configurations, vary widely and will likely continue to evolve and change in the future.

A specification of a decoupling capacitor that may be considered while selecting a decoupling capacitor is its self-resonant frequency. Generally, a capacitor remains capacitive up to its self-resonance frequency. Above the self-resonance frequency, the capacitor may start to appear as an inductor. FIG. 1 illustrates a series equivalent circuit 20 of a capacitor. Generally, each capacitor has three different components: equivalent series resistance (ESR), equivalent series inductance (ESL), and the capacitance itself (C). The self-resonant frequency typically occurs at the point where the impedance of the capacitor (C) is equal to the impedance of the inductor (ESL). This relationship is illustrated by the following equations.

$$Z_C = \frac{1}{\omega C}$$

where $Z_C$ is impedance for the capacitor (C in FIG. 1), $\omega$ is frequency in radians ($\omega=2\pi f$), and C is capacitance of the capacitor (C in FIG. 1).

$$Z_L = \omega L,$$

where $Z_L$ is impedance for the inductor (ESL in FIG. 1) and L is inductance of the inductor (ESL in FIG. 1). At resonant frequency:

$$Z_C = Z_L, \quad \frac{1}{\omega C} = \omega L$$

$$\omega^2 = \frac{1}{LC} \text{ and } \omega = 2\pi f,$$

where f is frequency, $$f_R = \frac{1}{2\pi\sqrt{LC}},$$

where $f_R$ is the self-resonance frequency.

As shown in the self-resonance equation ($f_R$) above, a lower capacitance and a lower inductance yield a higher resonant frequency. A goal of using decoupling capacitors is to provide a low impedance path from a power supply to ground to shunt unwanted radio frequency (RF) energy, for example. Thus, it is typically desirable to choose a low inductance capacitor for a decoupling capacitor.

In a prior method, decoupling capacitors and bulk capacitors are distributed uniformly around the chip. Many of today's chips are complex and have systems on the chip (e.g., system-on-chip layout). Such chips typically have multiple types of devices, such as a analog PLL (phase locked loop) component, digital PLL component, general purpose processor, digital signal processor, ROM memory, RAM memory, digital bandgap, analog bandgap, voltage regulator, memory interface, clock circuitry, and combinations thereof, for example. In such chips having several different devices therein, such devices may be operating at different switching speeds (i.e., different clock frequencies), different voltages, and/or different currents. Generally, a higher switching frequency requires a smaller decoupling capacitor to sufficiently reduce the noise level, and a lower switching frequency requires a larger decoupling capacitor to sufficiently reduce the noise level. In such complex chips having two or more switching frequencies from multiple devices on the chip, a uniform distribution of same size decoupling capacitors may yield a non-uniform noise level across the chip. If the noise level is not uniform across the chip, it may create an antenna effect, which may result in more electromagnetic energy radiating from the chip during operation. This is commonly referred to as a differential mode radiation.

FIG. 2 is a bottom view of a simplified schematic for an example packaged chip 30 with uniformly distributed decoupling capacitors 32 and bulk capacitors 34, as is common in the prior art. FIG. 3 is a side view of packaged chip 30 and the capacitors 32, 34 of FIG. 2 operably mounted on a circuit board 36, for example. FIG. 4 shows a simplified electrical schematic 40 of how a decoupling capacitor and a bulk capacitor are typically connected to a chip lead for filtering unwanted noise.

Referring to FIG. 2, note that all of the decoupling capacitors 32 have the same values (0.01 µF), and note that all of the bulk capacitors 34 have the same values (22 µF). Also, note that the number of decoupling capacitors 32 and placement is the same on each side of the chip 30. However, the chip 30 shown in FIG. 2 is a system-on-chip device having a digital portion 42 (e.g., digital PLL, digital signal processor, general purpose processor), an analog portion 44 (e.g., analog PLL), and memory interfaces (e.g., external memory interface fast or EMIFF), for example. Each of these components of the chip 30 may operate at different switching speeds (different clock frequencies), different voltages, and/or different peak switching currents. Thus, with the uniform distribution of decoupling capacitors 32 shown in FIG. 2, the overall noise level across the chip 30 may not be uniform. This may cause a significant noise differential across the chip 30 and may lead to differential mode radiation, which is usually not desirable.

Typically chips and boards used or sold in the U.S. must pass FCC certification for the level of electromagnetic energy radiated from the device during operation (e.g., transmission of radio frequency signals generated by high frequency components on a chip generating noise leading to differential mode radiation). Generally, the larger the size of the chip, the greater the antenna effect generated by non-uniform noise levels across the chip. And, most complex chips today are growing in size and number of leads as more devices and systems are placed on the chip to increase system speeds and decrease power consumption, for example. Thus, if a chip has some level of noise, it is preferred to have the noise level as uniform as possible across or around the chip to reduce or eliminate the antenna effect. Hence, a need exists for a way to provide a more uniform noise level across a chip, especially as chip sizes increase, as the number of leads increases, and as multiple components running at different clock frequencies are placed on a single chip, for example.

SUMMARY OF THE INVENTION

The problems and needs outlined above may be addressed by embodiments of the present invention. In accordance with one aspect of the present invention, a method of selecting decoupling capacitors for a packaged semiconductor chip, is provided. This method includes the following steps described in this paragraph. The order of the steps may vary, may be sequential, may overlap, may be in parallel, and combinations thereof. At least some chip leads on the packaged semiconductor chip are grouped into at least two regions. This grouping may be based upon a consideration of the switching frequencies associated with the leads, for example. For each of the regions, a first lead count for the chip leads in a first lead category in that region is determined. For each of the regions, a second lead count for the chip leads in a second lead category, if any, in that region is determined. For each of the regions, a third lead count for the chip leads in a third lead category, if any, in that region is determined. For each lead category in each of the regions, a total switching current for that lead category in that region is determined based on the lead count for that lead category in that region. For each lead category in each of the regions, a total decoupling capacitance value for that lead category in that region is determined based on the total switching current for that lead category in that region, a maximum allowable voltage ripple selected for that lead category, and a voltage rise time selected for that lead category. The number of decoupling capacitors that may be allocated to each of the regions is determined. For each of the regions, a number of the decoupling capacitors for that region are allocated to each lead category. For each lead category in each of the regions, the total decoupling capacitance value for that lead category in that region is divided by the number of the decoupling capacitors allocated for that lead category in that region to obtain a desired individual capacitance value for each of the decoupling capacitors allocated for that lead category in that region. For each lead category in each of the regions, an actual decoupling capacitor is selected for each of the decoupling capacitors allocated for that lead category in that region. Each of the actual decoupling capacitors has an actual individual capacitance corresponding to the desired individual capacitance value for that allocated decoupling capacitor of that lead category in that region. Each of the actual decoupling capacitors of that lead category has a self-resonance frequency selected based on an operating frequency of the chip leads in that lead category.

In accordance with another aspect of the present invention, a method of selecting decoupling capacitors for a packaged semiconductor chip, is provided. This method includes the following steps described in this paragraph. The order of the steps may vary, may be sequential, may overlap, may be in parallel, and combinations thereof. At least some chip leads on the packaged semiconductor chip are grouped into at least two regions. A first lead count is determined for the chip leads in a first lead category in a selected region. A second lead count is determined for the chip leads in a second lead category, if any, in the selected region. For each lead category in the selected region, a total switching current is determined for that lead category in the selected region based on the lead count for that lead category in the selected region. For each lead category in the selected region, a total decoupling capacitance value is determined for that lead category in the selected region based on the total switching current for that lead category in the selected region. A number of decoupling capacitors is allocated to each lead category of the selected region. For each lead category in the selected region, the total decoupling capacitance value for that lead category are divided by the number of the decoupling capacitors allocated for that lead category in the selected region to obtain a desired individual capacitance value for each of the decoupling capacitors allocated for that lead category in the selected region. For each lead category in the selected region, an actual decoupling capacitor is selected for each of the decoupling capacitors allocated for that lead category. Each of the actual decoupling capacitors has an actual individual capacitance corresponding to the desired individual capacitance value for that allocated decoupling capacitor of that lead category in the selected region.

In accordance with yet another aspect of the present invention, an electronic device is provided, which includes: a packaged semiconductor chip, a first group of the decoupling capacitors, a second group of the decoupling capacitors, and a first bulk capacitor. The packaged semiconductor chip has a plurality of chip leads extending therefrom. The first group of the decoupling capacitors is electrically connected to a first select group of the chip leads in a first select region of the chip leads. The first group of decoupling capacitors each has a first decoupling capacitance and each has a first self-resonance frequency. The second group of the decoupling capacitors is electrically connected to a second select group of the chip leads in the first select region of the chip leads. The second group of decoupling capacitors each has a second decoupling capacitance and each has a second self-resonance frequency. The second decoupling capacitance differs from the first decoupling capacitance. The second self-resonance frequency differs from the first self-resonance frequency. The first bulk capacitor is electrically connected to at least one of the first select group of the chip leads in the first select region, the first bulk capacitor having a first bulk capacitance. The first bulk capacitance differs from the first and second decoupling capacitances.

The foregoing has outlined rather broadly features of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1:
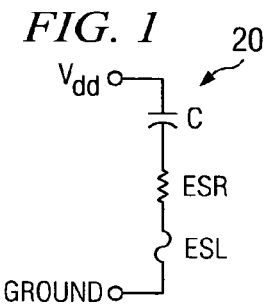
FIG. 1 shows a schematic of a series-equivalent circuit of a capacitor.
Figure 4:
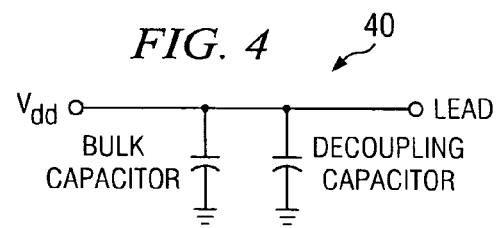
FIG. 4 shows a simplified electrical schematic of how a decoupling capacitor and a bulk capacitor are typically connected to a chip lead for filtering unwanted noise.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Figure 2:
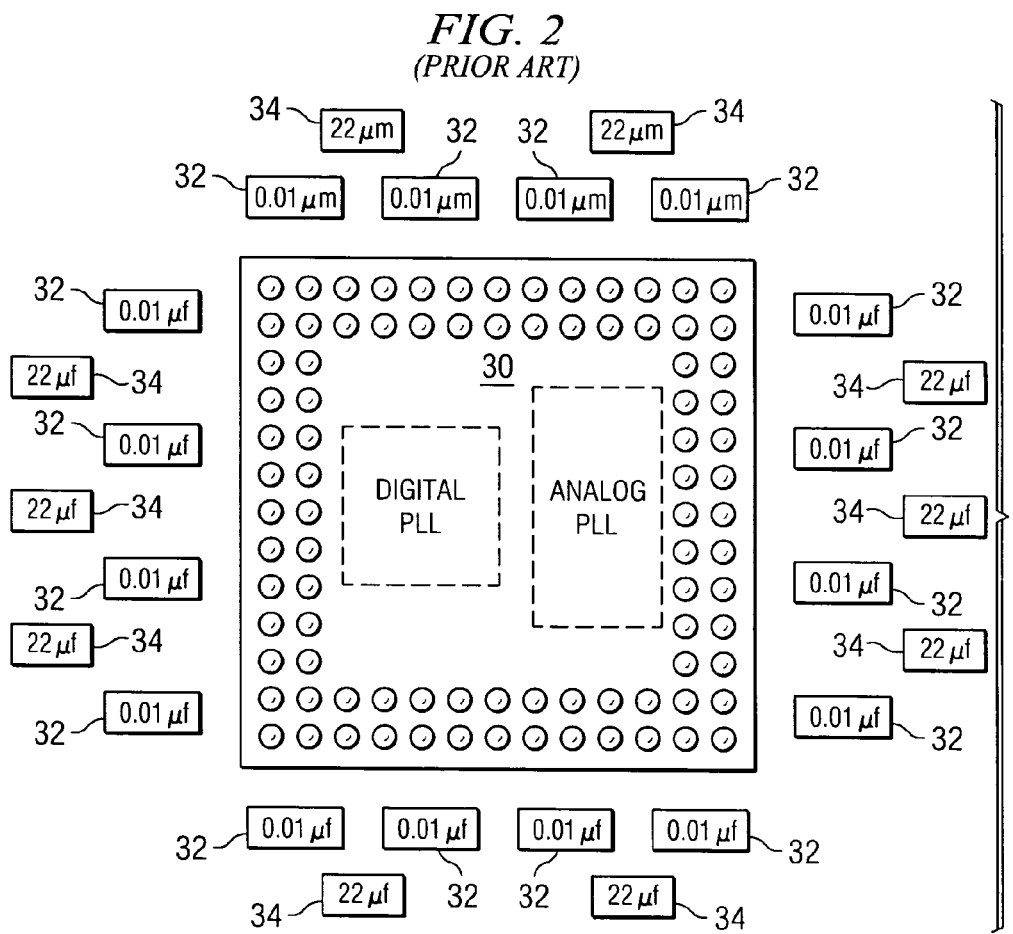
FIG. 2 is a bottom view of a simplified schematic for an example packaged chip with uniformly distributed decoupling and bulk capacitors.
Figure 3:
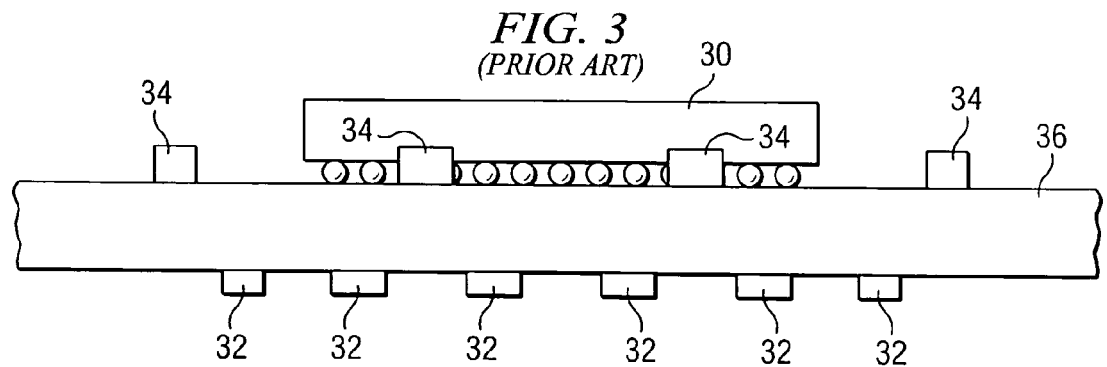
FIG. 3 is a side view of the packaged chip and the capacitors of FIG. 2 operably mounted on a printed circuit board.
Figure 5:
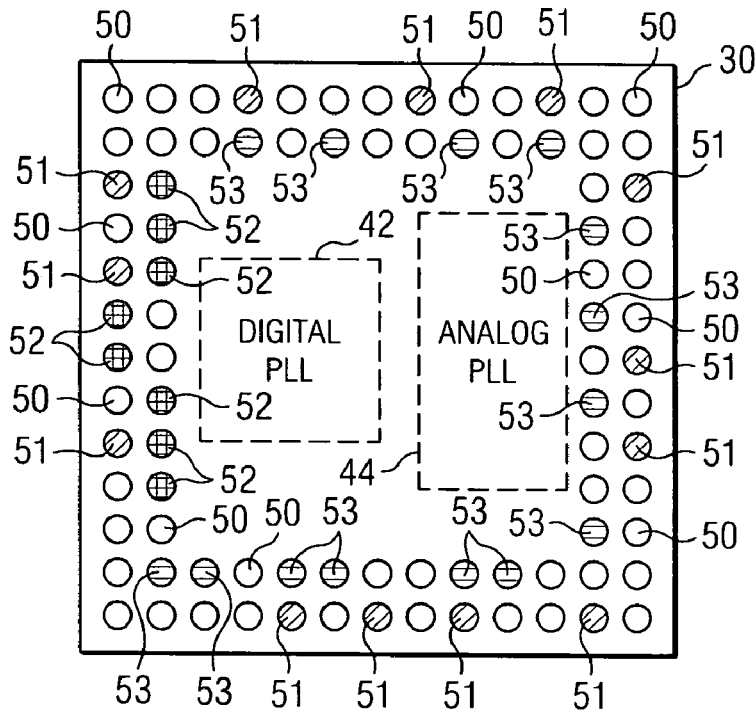
FIG. 5 shows the example chip of FIG. 2 with the leads categorized.

For purposes of comparison, the same chip 30 shown in FIG. 2 is used to illustrate an application of a first embodiment of the present invention. The chip 30 of FIG. 2 is shown in FIG. 5. In FIG. 5, the dashed borders shown around the digital and analog portions 42, 44 of the chip 30 are provided to illustrate that this example chip 30 is a complex chip having multiple devices running at different frequencies, different voltages, and/or different currents. In a typical or preferred chip layout, the leads for a certain component or device in the chip often will be clustered together and close to the component or device. This is a common layout practice to minimize the length of lines from the device to the leads. In other chips, however, the layout of the various components and their lead locations may vary greatly, as will be apparent to one of ordinary skill in the art. Also, the chip 30 in FIGS. 5–11 is shown with eighty-eight leads (50) for purposes of simplifying the drawings. An actual chip of this type may have more than 200 leads, for example.

In FIGS. 5–11, certain leads 51, 52, 53 on the chip are shown with various shading for purposes of illustrating different categories of leads. For example, a first lead category 51 is shaded with diagonal lines, a second lead category 52 is shaded with a square grid pattern, and a third lead category 53 is shaded with horizontal lines. In this example chip, the leads of the first lead category 51 are core voltage leads designed to accept about 1.6 volts at a clock frequency of about 150 MHz, the leads of the second lead category 52 are input/output (I/O) voltage leads designed to accept about 3.3 volts at a clock frequency of about 75 MHz, and the leads of the third category 53 are I/O voltage leads designed to accept about 3.3 volts at a clock frequency of about 40 MHz, for example. These are merely example lead categories, and in other embodiments, the number and type of lead categories may vary from those shown herein.

Figure 6:
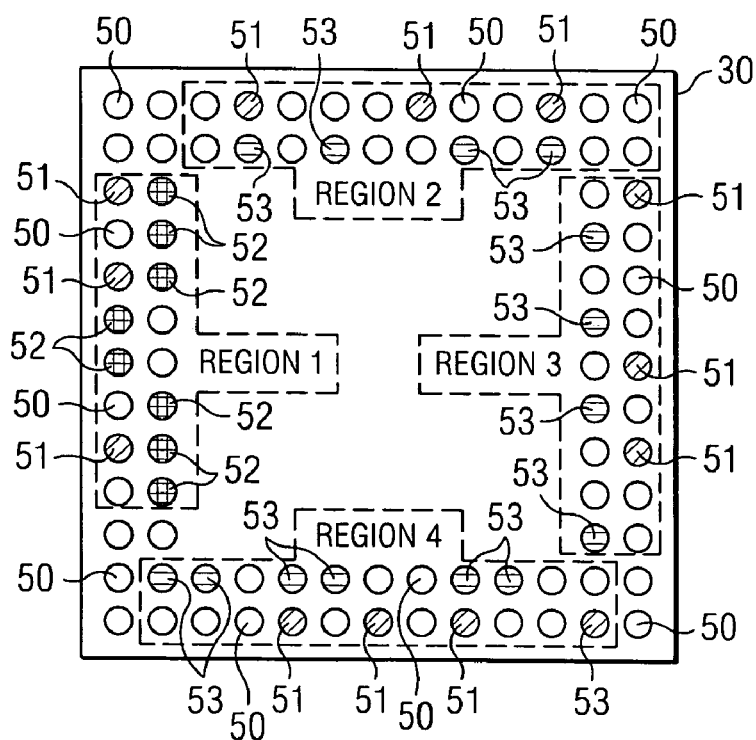
FIG. 6 shows the example chip of FIG. 5 with certain leads grouped into four regions.

Referring to FIG. 6, at least some of the leads 50 on the packaged semiconductor chip 30 are grouped into regions. In this example, four regions are used. In other embodiments, the number of regions may vary. An embodiment may group some or all of the leads 50 into two, three, four, five, six, seven, eight, nine, or ten regions, for example. The number of regions used for grouping leads 50 may be selected based on the number of leads, the chip size, the number of different lead categories, the number of critical leads needing decoupling capacitors, the location or placement of lead categories or certain leads, and/or the number of decoupling capacitors that will be used, for example. The regions may be selected by analyzing the switching frequencies associated with each chip lead. For example, a group of leads associated with memory interface for a given chip may have a switching frequency of 100 MHz. In such case, it may be preferable to group these like leads in a same region, for example. Also, it will often be preferred to the power and ground leads associated with a switching frequency in a same region, for example.

Referring to FIG. 6, the first region has three leads 51 in the first lead category and eight leads 52 in the second lead category. The second and third regions each have three leads 51 in the first lead category and four leads 53 in the third lead category. The fourth region has four leads 51 in the first lead category and six leads 53 in the third lead category. These lead counts for each lead category will be relevant in later calculations.

For purposes of discussion, the selection of the decoupling capacitors for the first region will be described first. A total switching current for each lead category in each region is calculated based on the lead count for each lead category in each region. Consulting a data manual for the chip 30 may provide a peak current consumption specification for the core leads (i.e., the first lead category 51) of 170 mA, for example. This value may be obtained from other sources. It is preferred, but not necessary, to provide a 100% safety margin for the peak current consumption value, for example. However, no safety margin or another safety margin may be used in other embodiments. To estimate the total switching current for each region, the following equation may be used:

$$I_{SR}=(I_S/N_L)(SF)(N_{LR}),$$

where $I_{SR}$ is the estimated switching current per region for a given group or category of leads, $I_S$ is the total peak switching current consumption for all leads of that group or category, $N_L$ is the total number of leads for that group or category, SF is the safety factor (e.g., 1=none, 2=100%), and $N_{LR}$ is the number of leads for that region for that group or category. Thus, to conservatively estimate the total peak current for the core leads 51 of the first lead category in the first region, the following calculation may be performed:

$$I_{SR}=(170 \text{ mA}/13)(2)(3)=78 \text{ mA}.$$

For the I/O voltage leads 52, 53 (i.e., second and third lead categories), the peak current consumption may be estimated by multiplying 4 mA by the total number of I/O leads (power and other leads) for each region. This provides a conservative estimate by assuming that all outputs and inputs are switching simultaneously. In this example, the first region has a total of 54 I/O leads (not shown in simplified drawing), for example. Thus, the estimated peak switching current for the I/O leads is: (4 mA)(54)=216 mA. In other embodiments, however, the total switching current for the core, I/O, or other leads may be estimated, selected, and/or calculated in another way, as may be apparent to one of ordinary skill in the art.

Because the core voltage leads 51 (first lead category) and the I/O voltage leads 52 (second lead category) are operating at different frequencies in this example, it is preferred to decouple the first and second lead categories 51, 52 using different decoupling capacitors. Next, the total decoupling capacitance for each lead category of the first region may be calculated using the following equation:

$$C_D=(I_{SR})(\Delta t/\Delta V),$$

where $C_D$ is the total decoupling capacitance for a lead category of a region, $I_{SR}$ is the total switching current for that lead category in that region, $\Delta t$ is the rise time selected for that lead category, and $\Delta V$ is the maximum allowable ripple voltage selected for that lead category.

For this example, the maximum allowable ripple voltage is assumed to be 10 mV and the rise time is assumed to be 1 ns. Such values may be selected based on the data manual or specifications for the chip, for example. Thus, to determine a total decoupling capacitance value for the first lead category 51 in the first region for this example, the following calculation may be used:

$$C_{D1-1}=(78 \text{ mA})(1 \text{ ns})/(10 \text{ mV})=0.0078 \text{ μF}.$$

Similarly, the total decoupling capacitance value for the second lead category 52 of the first region may be calculated as:

$$C_{D2-1}=(216 \text{ mA})(1 \text{ ns})/(10 \text{ mV})=0.022 \text{ μF}.$$

Because there are three core voltage leads 51 (first category leads) with an operation frequency of 150 MHz and eight I/O voltage leads 52 (second category leads) with an operation frequency of 75 MHz, it is preferred to have multiple decoupling capacitors for these multiple power supply leads. Ideally, each of these leads would get its own decoupling capacitor. But due to the physical space limitations on a typical computer circuit board, there is often not enough board space to place a decoupling capacitor on every critical lead. Thus, as a practical compromise, fewer decoupling capacitors will often be used. In this example, it is assumed that there is enough board space to place up to four decoupling capacitors per region (for four regions). Hence, the first region may be allocated four decoupling capacitors, for example.

With the number of decoupling capacitors allocated for the first region determined, the number of decoupling capacitors allocated to each lead category in the first region is next determined. In this example, two decoupling capacitors are allocated to the first lead category of the first region, and two decoupling capacitors are allocated to the second lead category of the first region. In other embodiments, the number of decoupling capacitors allocated to each region and to each lead category may vary. Also, each lead category and/or each region may or may not have equal numbers of decoupling capacitors allocated thereto.

With the number of decoupling capacitors allocated to the first and second lead categories of the first region, the desired individual capacitance value for each of the allocated decoupling capacitors may be determined. For example, the total decoupling capacitance value for each lead category of the first region may be divided by the number of decoupling capacitors allocated for that lead category in the first region to obtain the desired individual capacitance value for each of them. Thus, for the first lead category in the first region, 0.0078 μF/2 (two decoupling capacitors) yields a desired individual capacitance of 0.0039 μF. And for the second lead category in the first region, 0.022 μF/2 (two decoupling capacitors) yields a desired individual capacitance of 0.011 μF.

Next, actual decoupling capacitors are selected that have an actual individual capacitance close to or around the same value as the desired individual capacitance (i.e., using the above-calculated desired individual capacitance as a guideline), and that preferably have a self-resonant frequency close to or around the same value as the operating frequency of that lead category (e.g., 150 MHz for the first lead category and 75 MHz for the second lead category in this example). As is well known to one of ordinary skill in the art, the ability to make or select an actual capacitor with a actual individual capacitance and an actual self-resonance frequency that exactly matches a desired individual capacitance and/or a desired self-resonance frequency may be physically impossible and/or not practical (i.e., too expensive or too long of a lead time). Thus, the selected decoupling capacitors may have actual capacitance and self-resonance frequency values different than the desired capacitance and self-resonance frequency values calculated using an embodiment of the present invention. Generally, when given the choice, it will typically be preferred to select a decoupling capacitor with a self-resonance frequency closer to the desired self-resonance frequency and with the capacitance not as close to the desired capacitance, than to select a decoupling capacitor with a capacitance closer to the desired capacitance and with the self-resonance frequency not as close to the desire self-resonance frequency.

Figure 7:
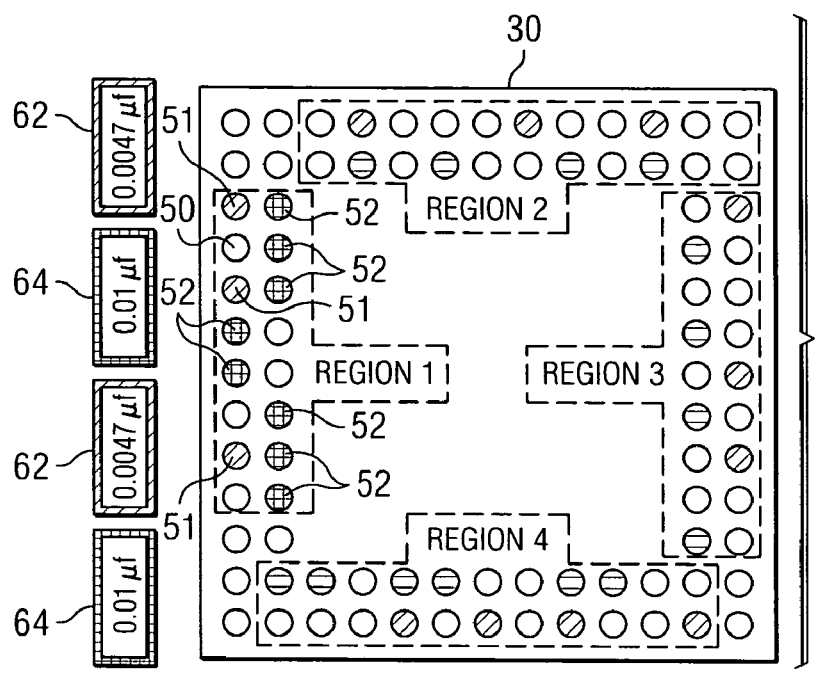
FIG. 7 shows the example chip of FIG. 7 with four decoupling capacitors selected for the first region.

Back to the example, two 0.0047 µF ceramic capacitors 62 having a self-resonance frequency of about 150 MHz may be selected for the first lead category (core voltage leads) of the first region, as illustrated in FIG. 7. And for the I/O voltage leads of the second lead category of the first region (see FIG. 7), two 0.01 µF ceramic capacitors 64 having a self-resonance frequency of about 75 MHz may be selected, for example.

Figure 8:
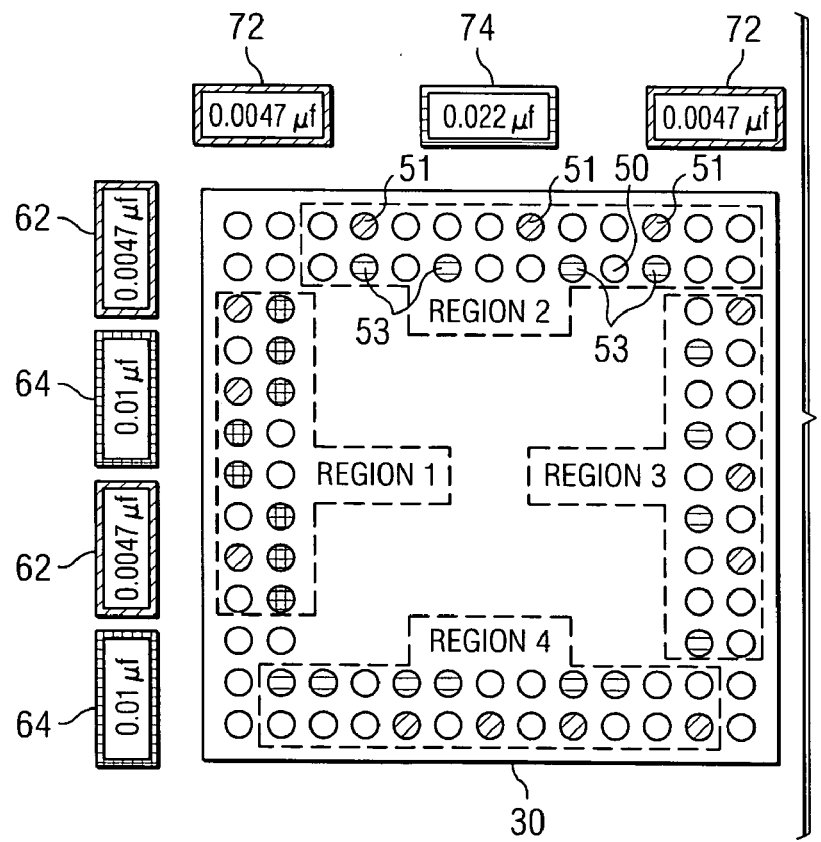
FIG. 8 shows the example chip of FIG. 7 with the addition of three decoupling capacitors selected for the second region.

The steps described above for selecting the decoupling capacitors 62, 64 for the first region may be also used to select the decoupling capacitors for the second, third, and fourth regions in this example. Considering the second region, it has three core voltage leads 51 in the first lead category and four I/O voltage leads 53 in the third lead category. The conservative estimate of the total peak switching current for the first and third lead categories of the second region are 78 mA and 236 mA, respectively, for example. Based on these switching current values, the total desired capacitances for the first and third lead categories of the second region are 0.0078 µF and 0.024 µF, respectively (based on the same selections/assumptions of a 1 ns rise time and a maximum allowable ripple voltage of 10 mV). As discussed above, four decoupling capacitors were allocated to the second region. Two of these decoupling capacitors may be allocated for the first lead category of the second region, for example. Because the I/O peripherals in the second region are running at speeds at or less than 40 MHz in this example, one decoupling capacitor may be allocated for the third lead category of the second region. Hence, not all of the allocated decoupling capacitors for a region need to be used in some cases. For the first lead category in the second region, 0.0078 µF/2 (two decoupling capacitors) yields a desired individual capacitance of 0.0039 µF. And for the third lead category in the second region, 0.024 µF/1 (one decoupling capacitors) yields a desired individual capacitance of 0.024 µF. Thus, two 0.0047 µF ceramic capacitors 72 having a self-resonance frequency of about 150 MHz may be selected for the first lead category (core voltage leads) of the second region, as illustrated in FIG. 8. And for the I/O voltage leads 53 of the third lead category of the second region (see FIG. 8), one 0.022 µF ceramic capacitor 74 having a self-resonance frequency of about 40 MHz may be selected, for example.

Figure 9:
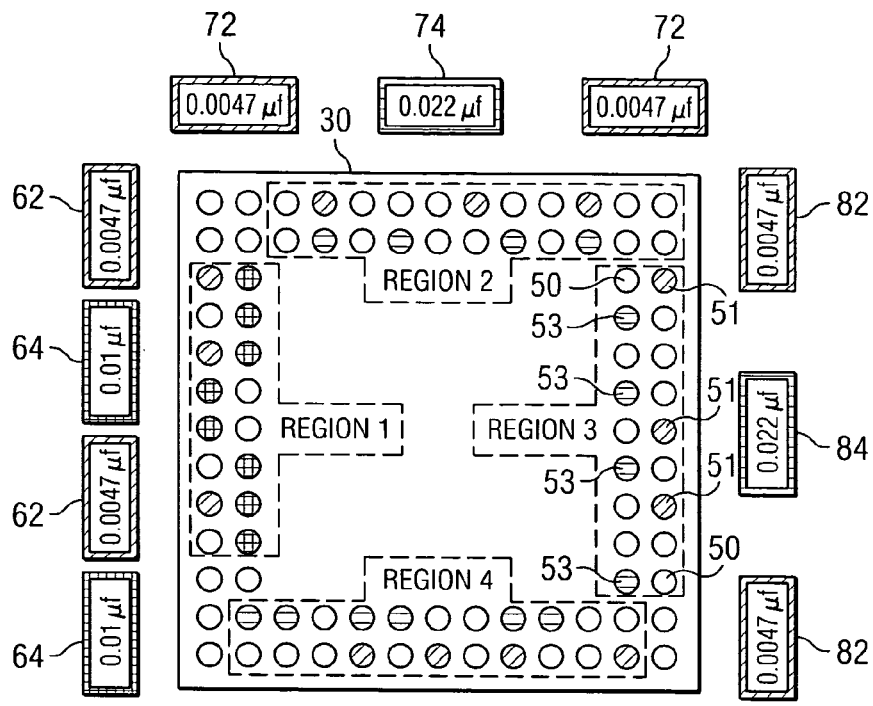
FIG. 9 shows the example chip of FIG. 8 with the addition of three decoupling capacitors selected for the third region.

Considering the third region next, it has three core voltage leads 51 in the first lead category and four I/O voltage leads 53 in the third lead category, which is the same as the second region. Hence, the same calculations may be performed for the third region as in the second region. Thus, two 0.0047 µF ceramic capacitors 82 having a self-resonance frequency of about 150 MHz may be selected for the first lead category (core voltage leads) of the third region, as illustrated in FIG. 9. And for the I/O voltage leads 53 of the third lead category of the third region (see FIG. 9), one 0.022 µF ceramic capacitor 84 having a self-resonance frequency of about 40 MHz may be selected, for example.

Figure 10:
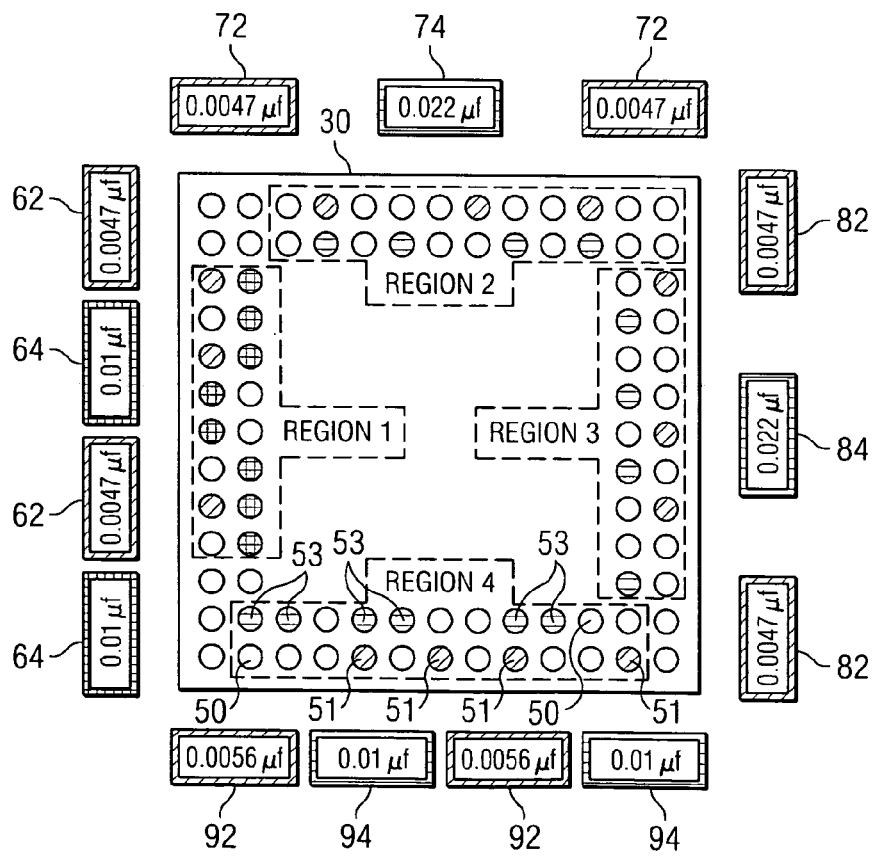
FIG. 10 shows the example chip of FIG. 9 with the addition of four decoupling capacitors selected for the fourth region.

Considering the fourth region, it has four core voltage leads 51 in the first lead category and six I/O voltage leads 53 in the third lead category. Conservative estimates of the total peak switching current for the first and third lead categories of the fourth region are 104 mA and 220 mA, respectively, for example. Based on these switching current values, the total desired capacitances for the first and third lead categories of the fourth region are 0.01 µF and 0.022 µF, respectively (based on the same selections/assumptions of a 1 ns rise time and a maximum allowable ripple voltage of 10 mV). As discussed above, four decoupling capacitors were allocated to the fourth region. Two of these decoupling capacitors may be allocated for the first lead category of the fourth region, and the other two may be allocated to the third lead category of the fourth region, for example. For the first lead category in the fourth region, 0.01 µF/2 (two decoupling capacitors) yields a desired individual capacitance of 0.005 µF. And for the third lead category in the fourth region, 0.022 µF/2 (two decoupling capacitors) yields a desired individual capacitance of 0.011 µF. Thus, two 0.0056 µF ceramic capacitors 92 having a self-resonance frequency of about 150 MHz may be selected for the first lead category (core voltage leads) of the fourth region, as illustrated in FIG. 10. And for the I/O voltage leads 53 of the third lead category of the fourth region (see FIG. 10), two 0.01 µF ceramic capacitors 94 having a self-resonance frequency of about 40 MHz may be selected, for example.

Figure 11:
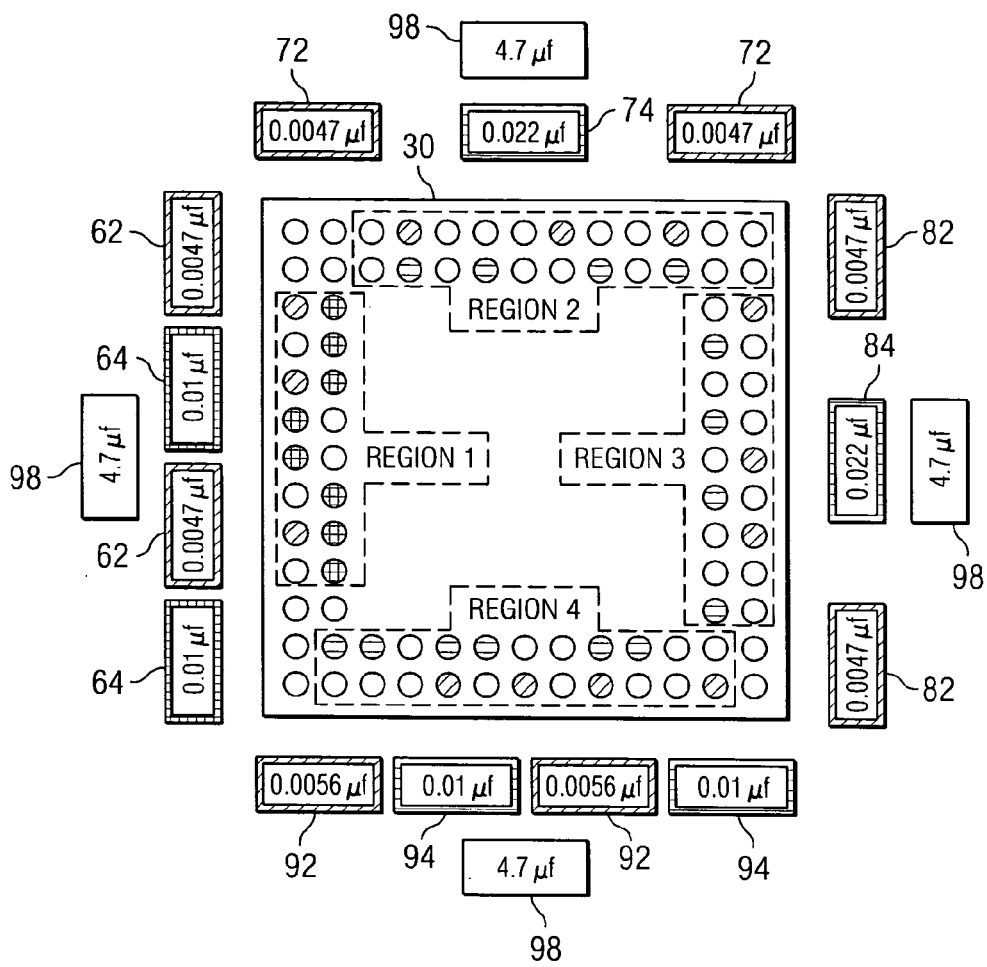
FIG. 11 shows the example chip of FIG. 10 with the addition of four bulk capacitors.

Optionally, yet preferably, bulk capacitors may be added as well to filter low frequency voltage and/or to recharge some or all of the decoupling capacitors, for example. In FIG. 11, bulk capacitors 98 have been selected and added along with the decoupling capacitors. A general rule of thumb that may be used for selecting the capacitance value of the bulk capacitors 98 is a bulk capacitance of at least ten times the total decoupling capacitance. For this example, the total decoupling capacitance is about 0.88 µF. Hence, the total bulk capacitance is preferably greater than 8.8 µF. In this example, four bulk capacitors 98 are used, one for each region. Thus, each of the bulk capacitors may be a tantalum capacitor with a capacitance of 4.7 µF, for example. The bulk capacitors 98 of FIG. 11 may be alternated between the core and I/O decoupling capacitors. In other words, the bulk capacitors 98 in the first and third regions may be used for the core leads 51, and the bulk capacitors 98 in the second and fourth regions may be used for the I/O leads 53, for example. In other embodiments, however, the size of each bulk capacitor may vary for each or some of the regions, and the type of capacitor may vary from the example given herein. Also, the number of bulk capacitors per region may vary, and different regions may have different numbers of bulk capacitors.

For the placement of the decoupling capacitors, it is preferred to have the decoupling capacitors as close as possible to their respective leads. And for the bulk capacitors, it is preferred to place the bulk capacitors as close to the decoupling capacitors as possible. This minimizes trace lengths and, therefore, minimizes the current loops. In general, lowering the current loops will lower the electromagnetic radiation and reduce parasitic inductance.

Figure 12:
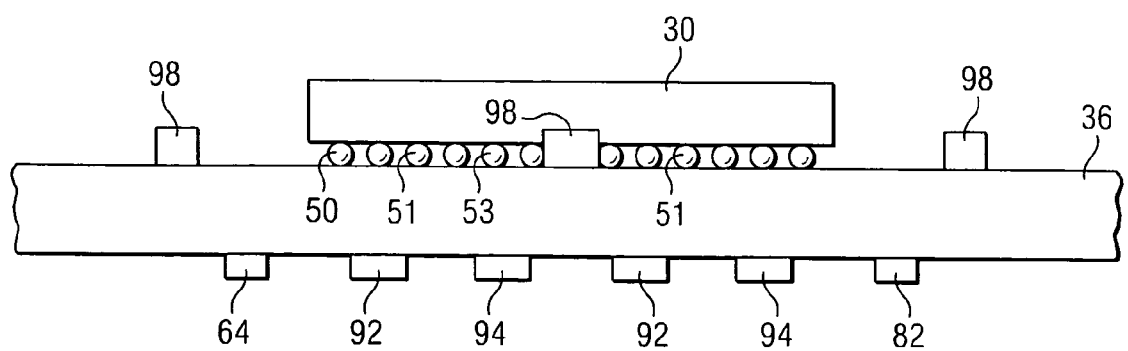
FIGS. 12–15 are side views of the example packaged chip and the capacitors of FIG. 11 in combination with a printed circuit board to illustrate some example configurations.
Figure 13:
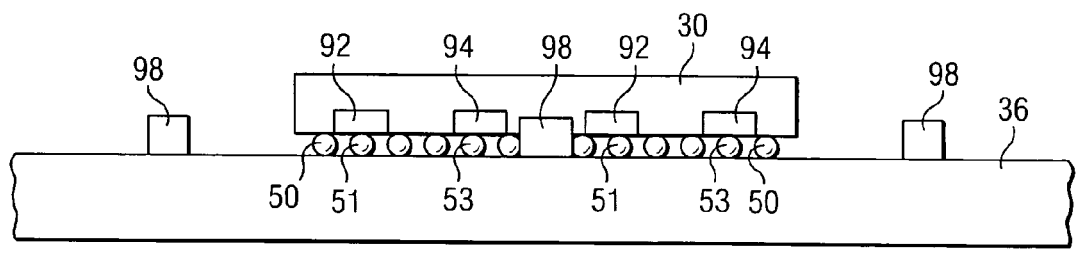
Figure 14:
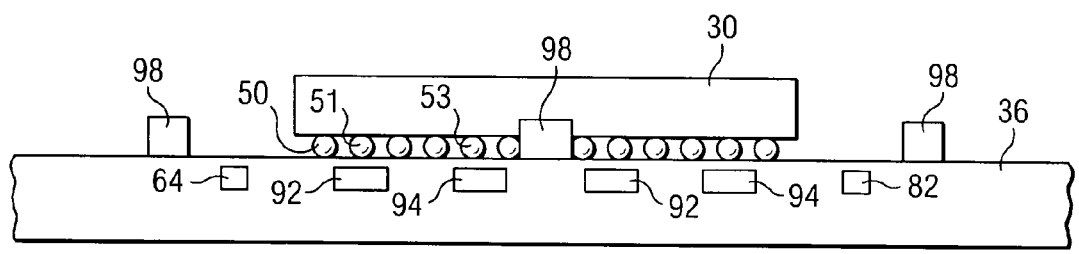
Figure 15:
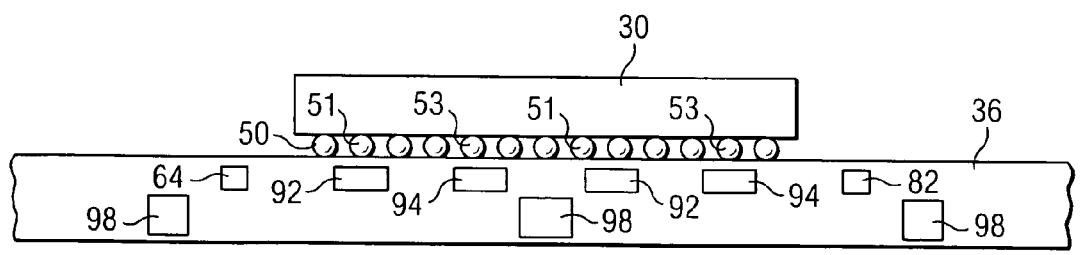

There are many different alternatives and options for placement of the decoupling and bulk capacitors. FIGS. 12–15 are simplified side views of the example packaged chip 30 and the capacitors of FIG. 11 in combination with a printed circuit board 36 to illustrate some example configurations. In FIG. 12, the decoupling capacitors (62, 64, 72, 74, 82, 84, 92, 94) are located on the bottom side of the circuit board 36, and the bulk capacitors 98 are located on the top side of the circuit board 36. In FIG. 13, the decoupling capacitors (62, 64, 72, 74, 82, 84, 92, 94) are built into the package substrate (not shown in detail) of the packaged chip 30. In FIG. 14, the decoupling capacitors (62, 64, 72, 74, 82, 84, 92, 94) are built into the circuit board 36. In FIG. 15, the decoupling capacitors (62, 64, 72, 74, 82, 84, 92, 94) and the bulk capacitors 98 are built into the circuit board 36. These are just a few illustrative examples for some placements of the decoupling and bulk capacitors. One of ordinary skill in the art will likely realize many other placements and configurations.

Although embodiments of the present invention and at least some of its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of selecting decoupling capacitors for a packaged semiconductor chip, comprising:
   grouping at least some chip leads on the packaged semiconductor chip into at least two regions;
   for each of the regions, determining a first lead count for the chip leads in a first lead category in that region;
   for each of the regions, determining a second lead count for the chip leads in a second lead category, if any, in that region;
   for each of the regions, determining a third lead count for the chip leads in a third lead category, if any, in that region;
   for each lead category in each of the regions, determining a total switching current for that lead category in that region based on the lead count for that lead category in that region;
   for each lead category in each of the regions, determining a total decoupling capacitance value for that lead category in that region based on the total switching current for that lead category in that region, a maximum allowable voltage ripple selected for that lead category, and a voltage rise time selected for that lead category;
   determining how many decoupling capacitors may be allocated to each of the regions;
   for each of the regions, allocating a number of the decoupling capacitors for that region to each lead category;
   for each lead category in each of the regions, dividing the total decoupling capacitance value for that lead category in that region by the number of the decoupling capacitors allocated for that lead category in that region to obtain a desired individual capacitance value for each of the decoupling capacitors allocated for that lead category in that region; and
   for each lead category in each of the regions, selecting an actual decoupling capacitor for each of the decoupling capacitors allocated for that lead category in that region, wherein each of the actual decoupling capacitors has an actual individual capacitance corresponding to the desired individual capacitance value for that allocated decoupling capacitor of that lead category in that region, and wherein each of the actual decoupling capacitors of that lead category has a self-resonance frequency selected based on an operating frequency of the chip leads in that lead category.

2. The method of claim 1, further comprising:
   selecting at least one bulk capacitor for at least one of the regions.

3. The method of claim 1, further comprising:
   for at least one of the regions, selecting a bulk capacitor having a bulk capacitance of about or greater than ten times the total decoupling capacitance value for that region.

4. The method of claim 1, wherein the first lead category comprises core supply voltage leads.

5. The method of claim 4, wherein the second lead category comprises a first group of input/output supply voltage leads.

6. The method of claim 5, wherein the third lead category comprises a second group of input/output supply voltage leads, and wherein the third lead category has a different operating frequency than the second lead category.

7. The method of claim 1, wherein each of the lead categories has a different operating frequency.

8. The method of claim 1, wherein at least some of the lead categories have different supply voltage levels.

9. The method of claim 1, wherein at least some of the lead categories have different switching current levels.

10. The method of claim 1, wherein the total switching current is a total peak switching current.

11. The method of claim 1, wherein the selected voltage rise time for each lead category is an estimated voltage rise time based on specifications for the packaged semiconductor chip.

12. The method of claim 1, wherein the selected maximum allowable voltage ripple for each lead category is an estimated maximum allowable voltage ripple based on specifications for the packaged semiconductor chip.

13. The method of claim 1, wherein the selected self-resonance frequency for the actual decoupling capacitors is about the same as the operating frequency of the chip leads in that lead category.

14. The method of claim 1, wherein the grouping of chip leads yields a number of regions selected from a group consisting of two, three, four, five, six, seven, eight, nine, and ten.

15. The method of claim 1, wherein the actual individual capacitance is about equal to or greater than the desired individual capacitance value for that allocated decoupling capacitor of that lead category in that region.

16. The method of claim 1, wherein the grouping of chip leads into regions is based upon considering switching frequencies of the leads.

17. A method of manufacturing an electronic device comprising the method of claim 1.

18. A method of assembling a computer system comprising the method of claim 1.

19. A method of selecting decoupling capacitors for a packaged semiconductor chip, comprising:
   grouping at least some chip leads on the packaged semiconductor chip into at least two regions;
   determining a first lead count for the chip leads in a first lead category in a selected region;
   determining a second lead count for the chip leads in a second lead category, if any, in the selected region;
   for each lead category in the selected region, determining a total switching current for that lead category in the selected region based on the lead count for that lead category in the selected region;

for each lead category in the selected region, determining a total decoupling capacitance value for that lead category in the selected region based on the total switching current for that lead category in the selected region;

allocating a number of decoupling capacitors to each lead category of the selected region;

for each lead category in the selected region, dividing the total decoupling capacitance value for that lead category by the number of the decoupling capacitors allocated for that lead category in the selected region to obtain a desired individual capacitance value for each of the decoupling capacitors allocated for that lead category in the selected region; and for each lead category in the selected region, selecting an actual decoupling capacitor for each of the decoupling capacitors allocated for that lead category, wherein each of the actual decoupling capacitors has an actual individual capacitance corresponding to the desired individual capacitance value for that allocated decoupling capacitor of that lead category in the selected region.

20. A method of manufacturing an electronic device comprising the method of claim 19.

21. A method of assembling a computer system comprising the method of claim 19.

* * * * *